(12) United States Patent
Zhao et al.

(10) Patent No.: US 11,709,789 B2
(45) Date of Patent: *Jul. 25, 2023

(54) COMMAND BASED ON-DIE TERMINATION FOR HIGH-SPEED NAND INTERFACE

(71) Applicant: Innogrit Technologies Co., Ltd., Shanghai (CN)

(72) Inventors: Gang Zhao, Chandler, AZ (US); Wei Jiang, Fremont, CA (US); Jie Chen, Milpitas, CA (US); Lin Chen, Cupertino, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/514,079

(22) Filed: Oct. 29, 2021

(65) Prior Publication Data
US 2022/0050802 A1  Feb. 17, 2022

Related U.S. Application Data

(63) Continuation of application No. 16/853,868, filed on Apr. 21, 2020, now Pat. No. 11,200,190.

(51) Int. Cl.
G06F 13/40 (2006.01)
G11C 16/04 (2006.01)

(52) U.S. Cl.
CPC ...... G06F 13/4086 (2013.01); G11C 16/0483 (2013.01)

(58) Field of Classification Search
CPC .................................................. G06F 13/4086
USPC ........................................................ 710/105
See application file for complete search history.

(56) References Cited

U.S. PATENT DOCUMENTS

| 7,342,411 | B2* | 3/2008 | Vergis | G11C 29/50008 326/32 |
| 7,432,731 | B2* | 10/2008 | Bains | G11C 29/50008 326/56 |
| 7,516,281 | B2* | 4/2009 | LaBerge | G06F 13/4086 711/105 |
| 10,318,464 | B1* | 6/2019 | Jiang | G06F 13/1668 |
| 10,489,316 | B1* | 11/2019 | Prather | G06F 3/0604 |
| 11,200,190 | B2* | 12/2021 | Zhao | G06F 13/4086 |
| 2007/0126468 | A1* | 6/2007 | Kim | H04L 25/0278 326/30 |
| 2008/0164904 | A1* | 7/2008 | Kim | G11C 5/063 326/30 |
| 2008/0204071 | A1* | 8/2008 | Lee | G11C 7/1048 365/194 |

(Continued)

Primary Examiner — Paul R. Myers
(74) Attorney, Agent, or Firm — IPro, PLLC

(57) ABSTRACT

Systems, apparatus and methods are provided for multi-drop multi-load NAND interface topology where a number of NAND flash devices share a common data bus with a NAND controller. A method for controlling on-die termination in a non-volatile storage device may comprise receiving a chip enable signal on a chip enable signal line from a controller, receiving an on-die termination (ODT) command on a data bus from the controller while the chip enable signal is on, decoding the on-die termination command and applying termination resistor (RTT) settings in the ODT command to a selected non-volatile storage unit at the non-volatile storage device to enable ODT for the selected non-volatile storage unit.

16 Claims, 4 Drawing Sheets

(56) References Cited

U.S. PATENT DOCUMENTS

| | | | |
|---|---|---|---|
| 2009/0222637 A1* | 9/2009 | Kim | G11C 5/063 |
| | | | 711/E12.001 |
| 2011/0316580 A1* | 12/2011 | McCall | G06F 13/4086 |
| | | | 326/30 |
| 2012/0113733 A1* | 5/2012 | Kim | G11C 5/063 |
| | | | 365/191 |
| 2015/0244365 A1* | 8/2015 | Oh | G11C 11/401 |
| | | | 326/30 |
| 2016/0028395 A1* | 1/2016 | Bains | H03K 19/01825 |
| | | | 326/30 |
| 2016/0329099 A1* | 11/2016 | Takeyama | G11C 16/26 |
| 2017/0255412 A1* | 9/2017 | Cox | G06F 3/0656 |
| 2019/0155544 A1* | 5/2019 | Stave | G06F 3/0659 |
| 2020/0004436 A1* | 1/2020 | Jiang | G11C 5/04 |
| 2020/0027498 A1* | 1/2020 | Jeon | G11C 11/4096 |

* cited by examiner

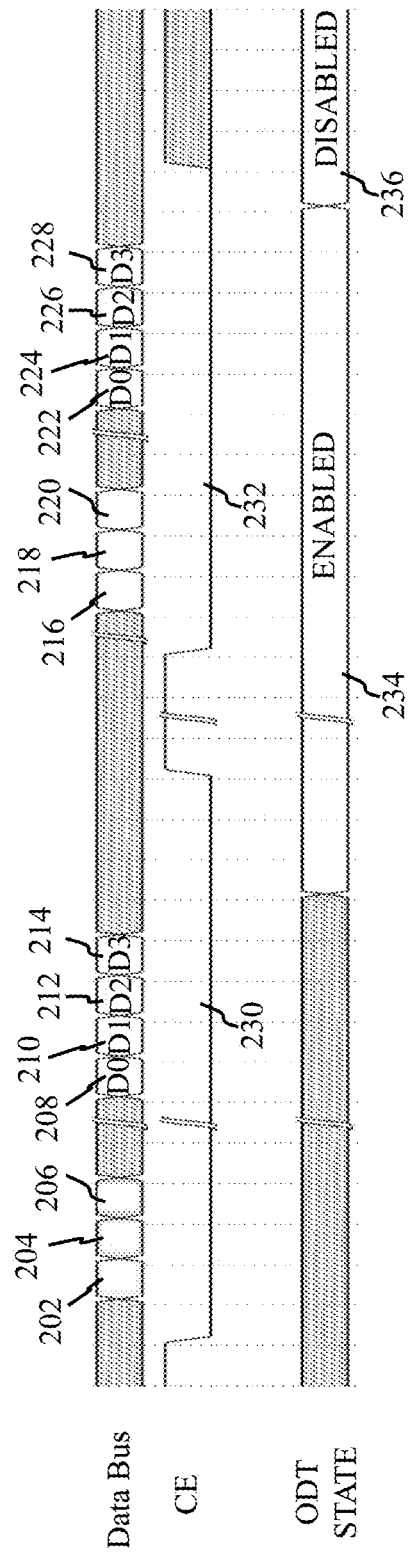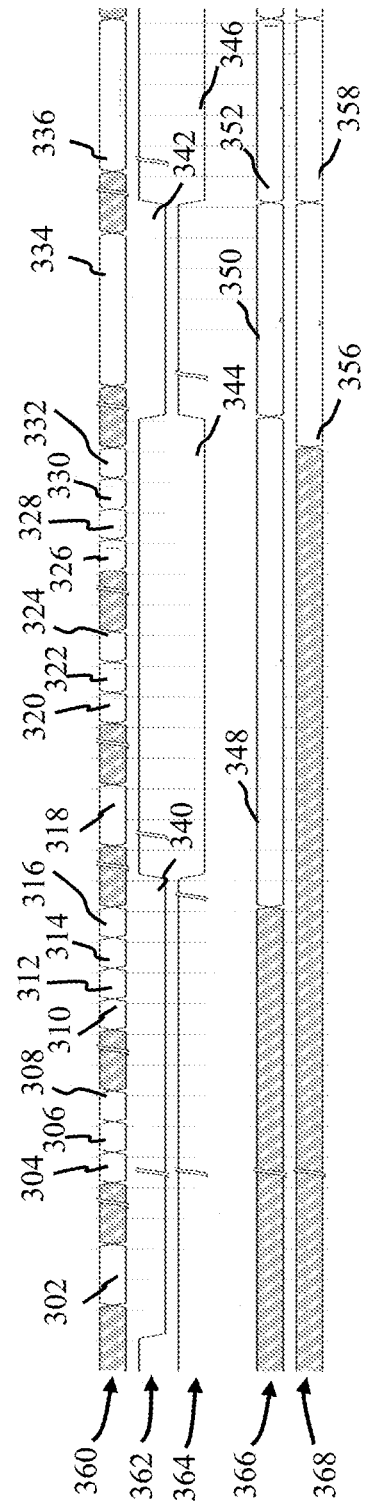
FIG. 2
FIG. 3

COMMAND BASED ON-DIE TERMINATION FOR HIGH-SPEED NAND INTERFACE

RELATED APPLICATIONS

This application is a continuation of U.S. patent application Ser. No. 16/853,868, filed Apr. 21, 2020, and entitled "COMMAND BASED ON-DIE TERMINATION FOR HIGH-SPEED NAND INTERFACE," the entire content of which is incorporated herein by reference.

TECHNICAL FIELD

This disclosure herein relates to the NAND flash interface, particularly relates to the multi-drop multi-load NAND interface topology where a number of NAND flash devices share a common data bus with a NAND controller.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use NAND flash devices to achieve data storage. The NAND flash devices are a family of integrated circuits that are manufactured by advanced process and assembly technologies to achieve multiple levels of vertical stacking of storages units into a small footprint of package for high capacity of storage.

A typical SSD consists of a controller and a number of NAND flash devices which are placed on and connected through a printer circuit board (PCB) with a standard form factor for various consumer or enterprise usage models. The interface between the controller and NAND flash devices is grouped into channels, and a modern controller usually has 4, 8 or 16 NAND channels. In order to achieve higher storage capacity, the SSD needs to integrate more NAND flash devices into the PCB, thereby resulting in multiple NAND devices sharing a single channel. As a result, a multi-load or multi-drop PCB topology is often in place for the design of high-density SSD.

The use of multi-load PCB topology, however, also introduces new challenges of signal integrity and timing closure degradations to the high-speed NAND flash interfaces. With the population of multiple NAND flash devices on one bus, the negative reflections from the capacitive load of one NAND flash device can travel through the PCB transmission lines and cause signal degradation onto the other NAND flash devices that shares the bus. The more NAND devices populated on the bus, the more severe the reflection problem becomes and the more significant signal integrity degradation it will cause. As a result, the NAND interface speed has to be reduced to accommodate for the signal integrity degradations, leading to performance compromise. Although the nature of the signal reflection and degradation in the NAND interface is similar to the multi-rank DRAM interface, the severity can be much higher for NAND as the capacitive loading per pin for a high-density NAND package is usually several times higher than that of a DRAM package, thus making the negative reflection much more significant.

To address the signal integrity challenges with a multi-load PCB topology, on-die termination (ODT) technology has been introduced for NAND interfaces, which integrates resistive terminations into the integrated circuit to help damp the reflections at the capacitive load. Although the ODT technique has been proven effective, it is equally important to enable and set the ODT values on each individual NAND flash devices that share a common data bus. For example, on a multi-load NAND bus, it is usually more effective to set a low resistor value for the ODT of the non-target NAND flash device that is not processing a command or conducting data transfer.

In the latest Open NAND Flash Interface Specifications (ONFI) Revision 4.1, the non-target ODT feature is supported through a two-step approach, an ODT configuration step and an ODT enabling step. This non-target ODT technique in the existing technologies, however, has a number of drawbacks when it comes to controller and system implementations. Moreover, this non-target ODT technology is lagging support among the mainstream NAND flash devices and controllers. Therefore, there is a need in the art to develop a more efficient and easy to implement ODT technique.

SUMMARY

The disclosed subject matter relates to systems, methods, and devices that provide a command-based non-target ODT technique for storage systems. The command-based non-target ODT technique may be a power-efficient approach to simplify the configuration and may enable non-target ODT at the system level. In various embodiments, target and non-target ODT configurations may be set using the same command. Embodiments according to the present disclosure do not require asserting multiple chip enable signals at the same time. Nor does it require new complicated controller circuit implementation to support various chip enable and ODT configurations for multiple PCB topologies. In some embodiments, the technique may be implemented at the firmware level without modifying existing controller hardware.

In an exemplary embodiment, there is provided a method for controlling on-die termination in a non-volatile storage device. The method may comprise: receiving a chip enable signal on a chip enable signal line from a controller, receiving an on-die termination (ODT) command on a data bus from the controller while the chip enable signal is on, decoding the on-die termination command and applying termination resistor (RTT) settings in the ODT command to a selected non-volatile storage unit at the non-volatile storage device to enable ODT for the selected non-volatile storage unit.

In another exemplary embodiment, there is provided a non-volatile storage system. The non-volatile storage system may comprise a controller and a non-volatile storage device coupled to the controller by at least a chip enable signal line and a data bus. The non-volatile storage device may be configured to receive a chip enable signal from the controller on the chip enable signal line, receive an on-die termination (ODT) command on the data bus from the controller while the chip enable signal is on, decode the on-die termination command and apply termination resistor (RTT) settings in the ODT command to a selected non-volatile storage unit at the non-volatile storage device.

BRIEF DESCRIPTION OF FIGURES

FIG. 2 schematically shows ODT commands from a NAND controller to enable and disable non-target ODT in accordance with an embodiment of the present disclosure.

FIG. 3 schematically shows ODT commands from a NAND controller to switch targets in accordance with an embodiment of the present disclosure.

DETAILED DESCRIPTION

Figure 1A:
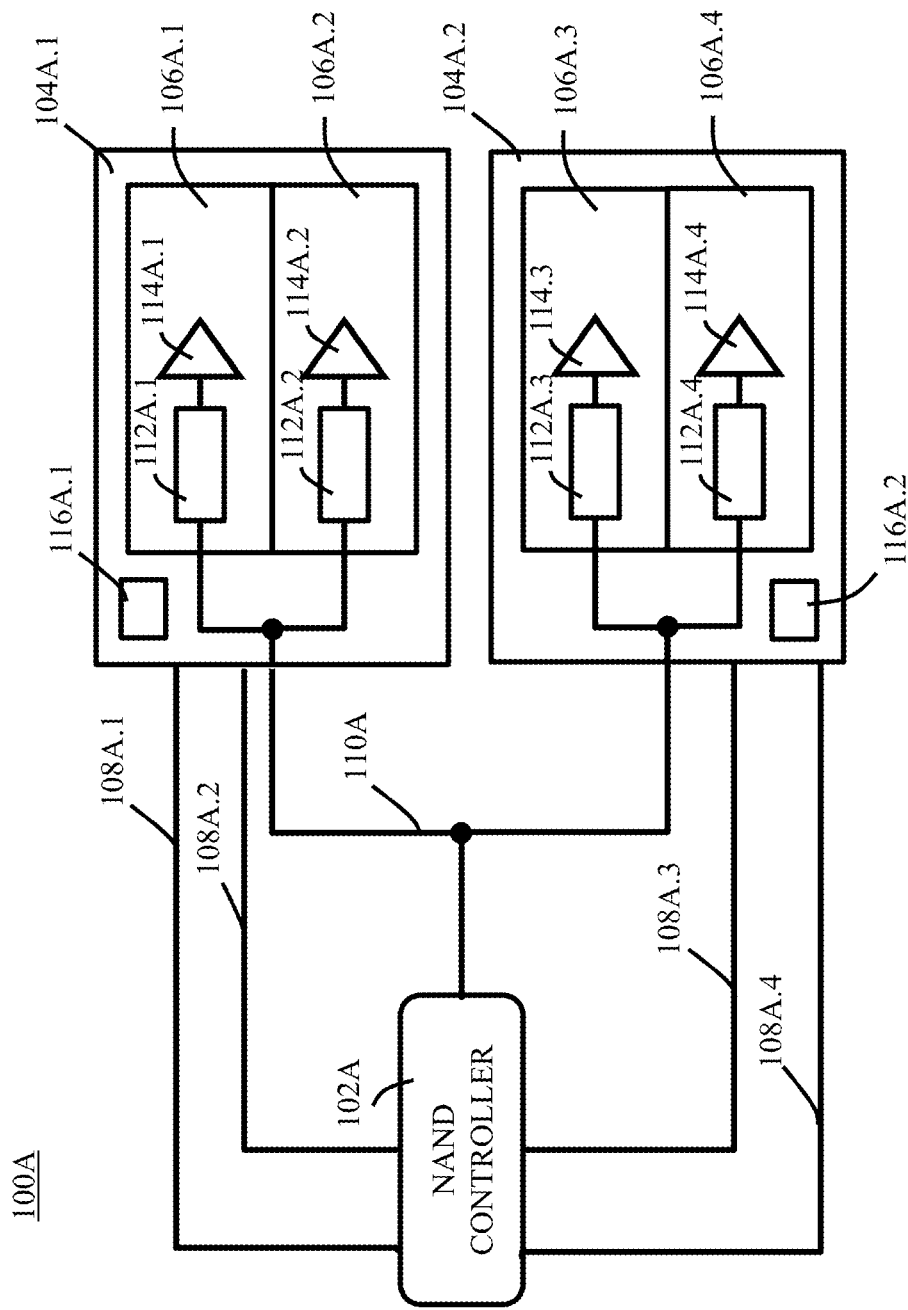
FIG. 1A schematically shows a NAND storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for configuring non-target ODT for non-volatile memory device based storage systems. As used herein, a non-volatile memory device may be a computer storage device that can maintain stored information after being powered off, and the stored information may be retrieved after being power cycled (turned off and back on). Non-volatile storage devices may include floppy disks, hard drives, magnetic tapes, optical discs, NAND flash memories, NOR flash memories, magnetoresistive random Access Memory (MRAM), resistive random access memory (RRAM), phase change random access memory (PCRAM), Nano-RAM, etc. In the description, a NAND flash may be used as an example to demonstrate the non-target ODT techniques. However, various embodiments according to the present disclosure may implement the techniques with other types of non-volatile storage devices.

FIG. 1A schematically shows an exemplary NAND storage system 100A according to an embodiment. The NAND storage system 100A may comprise a NAND controller 102A and a plurality of NAND devices 104A.1 and 104A.2. The NAND controller 102A may be coupled to the NAND devices 104A.1 and 104A.2 via a NAND interface that may include a plurality of signal lines. Some of the signal lines of the NAND interface may not need ODT, for example, chip enable (CE) 108A.1, CE 108A.2, CE 108A.3 and CE 108A.4. CE 108A.1 and CE 108A.2 may be coupled between the NAND controller 102A and the first NAND device 104A.1. CE 108A.3 and CE 108A.4 may be coupled between the NAND controller 102A and the second NAND device 104A.2. Some of the signal lines of the NAND interface may need ODT, for example, each signal line of a data bus, the differential pair of Strobe signals (DQS_P/DQS_N), and the differential pair of Read Enable signals (RE_P/RE_N), etc. A typical data bus may be 8 bits or 16 bits that has 8 signal lines that may be referred to as DQ0 through DQ7 respectively or 16 signal lines that may be referred to as DQ0 through DQ15 respectively. A single signal line 110A may be illustrated as a representative to demonstrate the ODT technique. The single signal line 110A may be one data signal line of the data bus, DQS, RE, or any signal line that needs ODT.

As shown in FIG. 1A, each of the NAND storage devices 104A.1 and 104A.2 may comprise a plurality of storage units. For example, the NAND storage device 104A.1 may comprise two storage units: 106A.1 and 106A.2, and the NAND storage device 104A.2 may comprise two storage units: 106A.3 and 106A.4. CE 108A.1 may be used by the NAND controller 102A for selecting the storage unit 106A.1. CE 108A.2 may be used by the NAND controller 102A for selecting the storage unit 106A.2. CE 108A.3 may be used by the NAND controller 102A for selecting the storage unit 106A.3. CE 108A.4 may be used by the NAND controller 102A for selecting the storage unit 106A.4.

The signal line 110A may have one end coupled to the NAND controller 102A and another end split into multiple ends coupled to signal pins in the storage units 106A.1 through 106A.4 respectively. That is, the signal line 110A is shared by all the storage units 106A.1 through 106A.4. The signal pins of each storage unit 106A.1 through 106A.4 may be connected to respective termination resistors: a termination resistor (RTT) 112A.1 in the storage unit 106A.1, a termination resistor 112A.2 in the storage unit 106A.2, a termination resistor 112A.3 in the storage unit 106A.3, and a termination resistor 112A.4 in the storage unit 106A.4. The other ends of each termination resistor may be connected to a reference voltage point 114A.1, 114A.2, 114A.3 and 114A.4 respectively. The reference voltage may be a middle point of power and ground (e.g., $V_{DD}/2$). In at least one embodiment, each of the termination resistors 112A.1, 112A.2, 112A.3 and 112A.4 may be an adjustable resistor. For example, the resistance of a termination resistor may be programmable and set by the NAND controller 102A. A termination resistor may also be referred to as an on-die terminator or resistive terminator. It should be noted that the signal pins of each storage unit 106A.1 through 106A.4 may also be separately connected to Input/Output receivers in respective storage unit in parallel to the termination resistors.

Each storage unit (e.g., 106A.1, 106A.2, 106A.3 and 106A.4) may be a logical unit (LUN) and assigned an identifier, which may be as referred to as a LUN address. A new feature address may be assigned to support ODT as a feature so that the ODT settings may be enabled or modified by a command. The command may be referred to as an ODT command. In various embodiments, different types of NAND flash devices may have the flexibility to assign different feature addresses.

In embodiments according to the present disclosure, the NAND controller 102A may send ODT commands through the NAND interface to the plurality of NAND storage devices 104A.1 and 104A.2 to turn on ODT and/or set resistive values for ODT. During operation of the NAND storage system 100A, one storage unit may be selected as a target while other storage units may be non-target. The target and non-target ODT may be set by the same command with different parameters. In some embodiments, the command may comprise a command type field that may contain a command code, one address field that may contain an address to identify which storage unit may be selected as the target, a feature address that may contain the feature address for ODT settings, and a plurality of data fields carrying configuration information for the target and non-target ODT settings.

In at least one embodiment, the command may be a Set Feature command, for example a Set Feature command with a command code of "D5" in hexadecimal (e.g., D5h). The NAND storage device 104A.1 may have a logic circuit 116A.1 and the NAND storage device 104A.2 may have a logic circuit 116A.2. The logic circuit 116A.1 and 116A.2 may be configured to decode the received ODT commands and turn on ODT according to the configuration in the commands. The resistance of the termination resistors 112A.1, 112A.2, 112A.3 and 112A.4 may be set by the logic circuit 116A.1 and logic circuit 116A.2 according to the settings in the ODT commands, respectively. The logic circuit 116A.1 and 116A.2 may be implemented in hardware, software, or combination of hardware and software. For example, the logic circuit 116A.1 and 116A.2 may be implemented by a microprocessor, a microcontroller, a field-programmable gate array (FPGA), or an application-specific IC (ASIC).

Figure 1B:
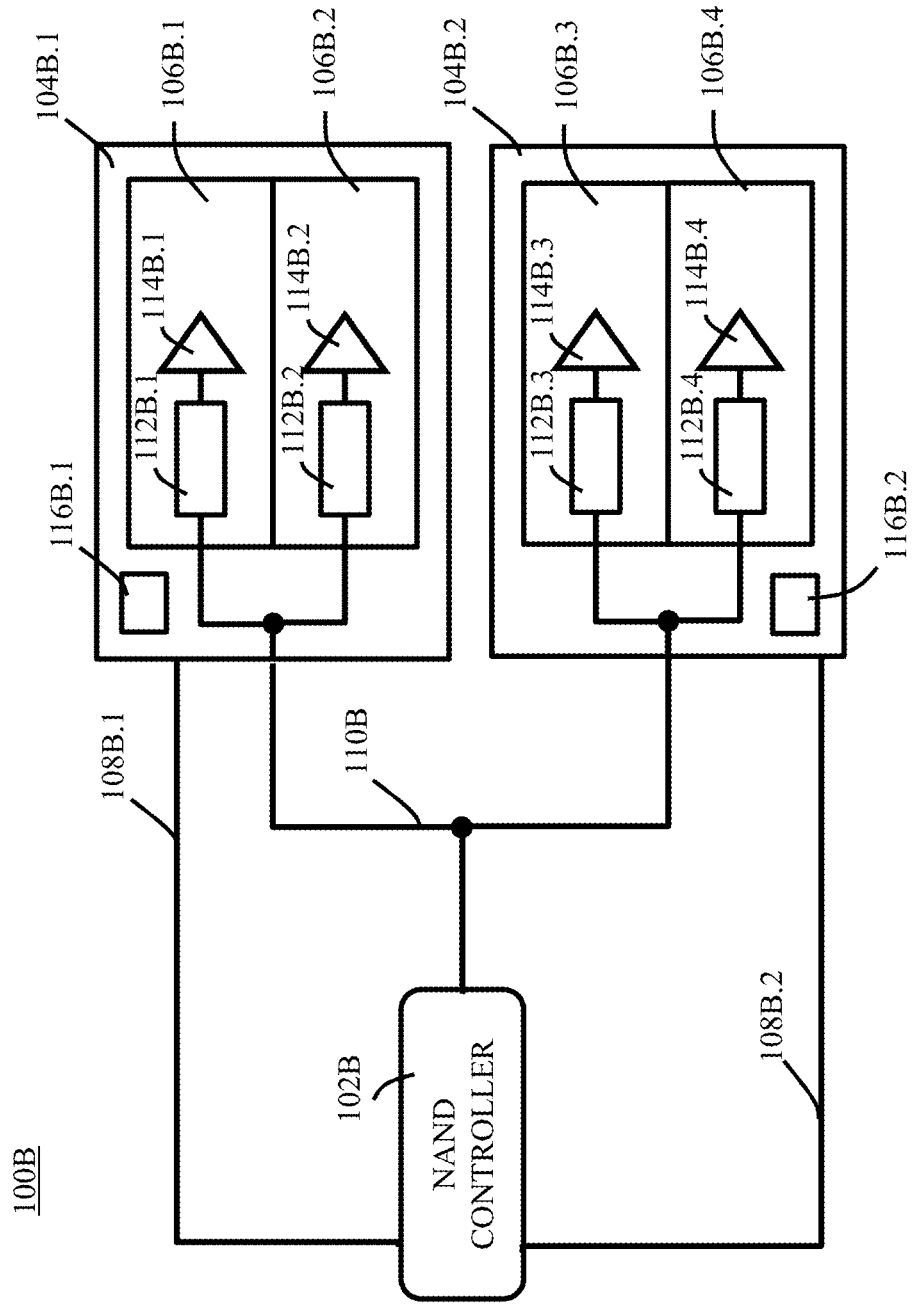
FIG. 1B schematically shows a NAND storage system in accordance with another embodiment of the present disclosure.

FIG. 1B schematically shows an exemplary NAND storage system 100B according to another embodiment. The NAND storage system 100B may comprise a NAND controller 102B and a plurality of NAND devices 104B.1 and 104B.2. The NAND controller 102B may be coupled to the NAND devices 104B.1 and 104B.2 via a NAND interface that may include a plurality of signal lines, for example, chip enable (CE) 108B.1 and CE 108B.2. CE 108B.1 may be coupled between the NAND controller 102B and the first NAND device 104B.1. CE 108B.2 may be coupled between the NAND controller 102B and the second NAND device 104B.2. A single signal line 110B may be illustrated as a representative to demonstrate a signal line that may need ODT. The single signal line 110B may be one data signal line of the data bus, DQS, RE, or any signal line that needs ODT.

The NAND storage device 104B.1 may comprise two storage units: 106B.1 and 106B.2, and the NAND storage device 104B.2 may comprise two storage units: 106B.3 and 106B.4. Each storage unit 106B.1, 106B.2, 106B.3 and 106B.4 may be a logical unit (LUN) and assigned a LUN address. CE 108B.1 may be used by the NAND controller 102B for selecting either the storage unit 106B.1 or the storage unit 106B.2 for data access operations. CE 108B.2 may be used by the NAND controller 102B for selecting either the storage unit 106B.3 or the storage unit 106B.4 for data access operations. That is, in the storage system 100B, a CE signal line may be shared by two storage units in a storage device.

The signal line 110B may have one end coupled to the NAND controller 102B and another end split into multiple ends coupled to signal pins in the storage units 106B.1 through 106B.4 respectively. That is, the signal line 110B is shared by all the storage units 106B.1 through 106B.4. The signal pins of each storage unit 106B.1 through 106B.4 may be connected to respective termination resistors: a termination resistor 112B.1 in the storage unit 106B.1, a termination resistor 112B.2 in the storage unit 106B.2, a termination resistor 112B.3 in the storage unit 106B.3, and a termination resistor 112B.4 in the storage unit 106B.4. The other ends of each termination resistor may be connected to a reference voltage point 114B.1, 114B.2, 114B.3 and 114B.4 respectively. The reference voltage may be a middle point of power and ground (e.g., $V_{DD}/2$). In at least one embodiment, each of the termination resistors 112B.1, 112B.2, 112B.3 and 112B.4 may be an adjustable resistor. For example, the resistance of a termination resistor may be programmable and set by the NAND controller 102B. It should be noted that the signal pins of each storage unit 106B.1 through 106B.4 may also be separately connected to Input/Output receivers in respective storage unit in parallel to the termination resistors.

The storage system 100B may implement the same ODT command as in the storage system 100A. In at least one embodiment, the command may be a Set Feature command with a command code of "D5" in hexadecimal (e.g., D5h). The NAND storage device 104B.1 may have a logic circuit 116B.1 and the NAND storage device 104B.2 may have a logic circuit 116B.2. The logic circuit 116B.1 and 116B.2 may be configured to decode the received ODT commands and turn on ODT according to the configuration in the commands. The resistance of the termination resistors 112B.1, 112B.2, 112B.3 and 112B.4 may be set by the logic circuit 116B.1 and logic circuit 116B.2 according to the settings in the ODT commands, respectively. The logic circuit 116B.1 and 116B.2 may be implemented in hardware, software, or combination of hardware and software. For example, the logic circuit 116B.1 and 116B.2 may be implemented by a microprocessor, a microcontroller, a field-programmable gate array (FPGA), or an application-specific IC (ASIC). However, because a CE signal line is shared by two storage units in one storage device, an ODT command with non-target settings may turn on non-target ODT for both storage units or one of the storage units controlled by the CE signal line. For example, if storage unit 106B.1 is selected for active access, an ODT command may be sent on the data bus to turn on non-target ODT for storage units 106B.3 and 106B.4. It should be noted that for signal integrity benefits, the ODT of only one LUN may need to be enabled and thus in another embodiment, the ODT of either storage unit 106B.3 or 106B.4 (e.g., one of them may be designated as a default to be turned on) may be turned on by one ODT command.

It should be noted that the storage system 100A and storage system 100B are just two examples. Embodiments according to the present disclosure may have one to N non-volatile storage devices with N being a positive integer. Each non-volatile storage device may have one to M non-volatile storage units. In general, M may be a power of two, for example, 2, 4, 8, etc. In one embodiments, a CE signal line may be used for controlling access to one non-volatile storage device that contains one storage unit. In another embodiment, a CE signal line may be used for controlling access to one non-volatile storage unit in a storage device that contains two storage units (e.g., CE 108A.1 for storage unit 106A.1 in FIG. 1A). In yet another embodiment, a CE signal line may be used for controlling access to a pair of non-volatile storage units (e.g., CE 108B.1 for storage units 106B.1 and 106B.2 in FIG. 1B) and a storage unit address may identify which of the storage unit is selected.

FIG. 2 schematically shows ODT commands from a NAND controller to enable and disable non-target ODT in accordance with an embodiment of the present disclosure. An ODT command may be transmitted from a NAND controller via the data bus to the NAND storage devices. The ODT command may be accompanied by a CE signal such that the CE enabled chip (e.g., NAND storage device) may receive and decode the ODT command. Other storage devices coupled to the NAND interface may also receive the signals for the ODT command, but these other NAND storage devices may ignore the ODT command because the CE signals are not enabled for them. FIG. 2 shows two ODT commands being transmitted from a NAND controller to a NAND storage device. The first ODT command may comprise a command type field 202, a first address field 204, a second address field 206 and four data fields: D0 208, D1 210, D2 212 and D3 214. The first ODT command may be transmitted with the CE signal 230. The second ODT command may comprise a command type field 216, a first address field 218, a second address field 220 and four data fields: D0 222, D1 224, D2 226 and D3 228. The second ODT command may be transmitted with the CE signal 232.

In the embodiment of NAND storage system 100A, ODT is applied at each LUN. In some embodiments, one of the two address fields for an ODT command may be a LUN address to identify which LUN of the NAND storage device is selected to enable its ODT according to the ODT command. In one embodiment, the command type (e.g., 202 and 216) may be a Set Feature command with code D5h, the first address (e.g., 204 and 218) may be a LUN address, the second address (e.g., 206 and 220) may be a feature address for ODT settings.

Assuming LUN 106A.1 of FIG. 1A may need to be actively accessed. Any one of LUN 106A.2, 106A.3, 106A.4 may turn on non-target ODT by the two commands of FIG. 2. Using LUN 106A.3 as an example, the CE signals 230 and 232 may be signals on the CE signal line 108A.3. After the first command is received by the NAND storage device 104A.2, the on-die terminator 112A.3 of the storage unit 106A.3 may be put in the enabled state 234 for non-target ODT. After the second command in FIG. 2 is received by the NAND storage device 104A.2, the on-die terminator 112A.3 of the storage unit 106A.3 may be put in the disabled state 236.

A termination resistor in the disabled state may be referred to as being turned off or in an off state, in which the termination resistor may be disconnected from the signal pin or equivalently set to a high-impedance. The ODT state of the termination resistor may affect the signal transferred on the signal line but does not affect the physical connection from the signal pin of a storage unit to the Input/Output (I/O) signal receiver. For example, if the termination resistor 112A.1 is disabled, the signal line 110A may still be connected to the I/O signal receiver in the storage unit 106A.1.

Using an 8-bit data bus as an example, the NAND interface may comprise 8 signal lines for data (e.g., DQ0 through DQ7), the differential pair of Strobe signals (DQS_P/DQS_N) and the differential pair of Read Enable signals (RE_P/RE_N) that may need ODT. The four data fields D0 through D3 may contain configurations for RTT settings and thus may also be referred to as configuration fields. RTT settings may specify the values of the resistive terminators for data, strobe and read enable. In one embodiment, an RTT setting may be a 4-bit field. When the four bits of an RTT are all zeros, which may be represented in a four-bit format as RTT=4b'0000, the ODT may be turned off (or setting resistance to high-impedance); when RTT is in the range of 4b'0001 to 4b'1111, the resistor of the ODT may be in discrete values ranged from 15-ohm to 300-ohm. Two bytes of RTT settings may be assigned to target and non-target ODT configurations, respectively.

An example implementation of the data fields D0 through D3 of an ODT command is demonstrated in Table 1.

TABLE 1

Example implementation of data field in the ODT command

| Data Field | DQ7 | DQ6 | DQ5 | DQ4 | DQ3 | DQ2 | DQ1 | DQ0 |
|---|---|---|---|---|---|---|---|---|
| D0 | RTT Setting for DQ[7 . . . 0] in non-target ODT | | | | RTT Setting for DQS in non-target ODT | | | |
| D1 | RTT Setting for RE in non-target ODT | | | Re-served | Re-served | Re-served | Automatic Enable |
| D2 | RTT Setting for DQ[7 . . . 0] in target ODT | | | | RTT Setting for DQS in target ODT | | | |
| D3 | RTT Setting for RE in target ODT | | | Re-served | Re-served | Re-served | Re-served |

As shown in Table 1, the data field D0 may comprise a four-bit RTT setting for the data signal lines DQ0 through DQ7 in non-target ODT and a four-bit RTT setting for the signal line DQS in non-target ODT. The data field D1 may comprise a four-bit RTT setting for the signal line RE in non-target ODT, three reserved bits and an Automatic Enable bit. The data field D2 may comprise a four-bit RTT setting for the data signal lines DQ0 through DQ7 in target ODT and a four-bit RTT setting for the signal line DQS in target ODT. The data field D3 may comprise a four-bit RTT setting for the signal line RE in target ODT and four reserved bits. It should be noted that in some embodiments, target ODT setting may be ODT off. That is, the target ODT may be no ODT (or setting the target RTT to a high-impedance).

An example implementation of the RTT setting of the ODT command is demonstrated in Table 2.

TABLE 2

Example of RTT setting

| Bit 3 | Bit 2 | Bit 1 | Bit 0 | RTT Value |
|---|---|---|---|---|
| 0 | 0 | 0 | 0 | ODT OFF |
| 0 | 0 | 0 | 1 | 150-ohm |
| 0 | 0 | 1 | 0 | 100-ohm |
| 0 | 0 | 1 | 1 | 75-ohm |
| 0 | 1 | 0 | 0 | 50-ohm |
| 0 | 1 | 0 | 1 | 37.5-ohm |

In some embodiments, the ODT for a LUN may stay on regardless of assertion or de-assertion of the chip enable signal after the ODT may be turned on. The ODT may be disabled by either a subsequent ODT command, a Read command or a RESET command. For example, as shown in FIG. 2, the second ODT command may put an ODT enabled LUN into the disabled ODT state (e.g., LUN 106A.3 becomes disabled from enabled).

As shown in Table 1, in one embodiment, the ODT configuration field may include a configuration setting for automatically enabling ODT (e.g., Automatic Enable bit). If this bit is set by the NAND controller in an ODT command, the NAND storage device receiving the ODT command may automatically apply target ODT for any Read operations and turn on non-target ODT after any of the Read operations. If this bit is not set by the NAND controller in an ODT command, the NAND storage device will not turn the non-target ODT back on after a Read operation, thus the NAND controller may need to send another ODT command to re-enable the non-target ODT.

In one embodiment, for the NAND storage system 100A, when one of the LUNs may need to be actively accessed, all other LUNs that are not to be actively accessed may receive the first command of FIG. 2 to turn on non-target ODT. In another embodiment, for the NAND storage system 100B, when one of the LUNs may need to be actively accessed, the LUN sharing the same CE signal line may not need to have its non-target ODT turned on and each of other pairs of LUNs sharing one CE signal line may need to have one LUN or both LUNs turn on non-target ODT. For example, if LUN 106B.1 may need to be actively accessed. LUN 106B.2 may not need to turn on non-target ODT and the first command of FIG. 2 may be sent to the NAND storage device 104B.2 with the CE 108B.2 enabled (e.g., CE signal 230) to turn on non-target ODT for either LUN 106B.3 or LUN 106B.4, or both.

FIG. 3 schematically shows ODT commands from a NAND controller to switch targets in accordance with an embodiment of the present disclosure. Target switching shown in FIG. 3 may be applied in a storage system in which each CE signal line may control one storage unit, for example, the NAND storage system 100A. Signal line 360 may represent the data bus between a NAND controller (e.g., the NAND controller 102A) and NAND storage devices (e.g., the NAND storage devices 104A.1 and 104A.2). Signal line 362 may represent the CE signal line (e.g., CE 108A.1) between the NAND controller and a selected NAND storage unit (e.g., 106A.1). Signal line 364 may represent the CE signal line (e.g., CE 108A.3) between the NAND controller and a second NAND storage unit (e.g., 106A.3). Status 366 may represent the non-target ODT state for the first NAND storage unit and status 368 may represent the non-target ODT state for the second NAND storage unit.

In one embodiment, the NAND controller may send out ODT commands during system power-on and NAND initialization stage. As shown in FIG. 3, an initialization command 302 may be sent on the data bus when the CE enabled signal 340 is on the signal line 362. While the CE enabled signal 340 is still on, a first ODT command may also be transmitted via the data bus. The first ODT command may comprise a command type field 304, a first address field 306, a second address field 308, and four data fields D0 310, D1 312, D2 314 and D3 316. The Automatic Enable bit may be set (e.g., on) in the RTT setting of the data fields of the first ODT command. After the first ODT command has been transmitted, the first NAND storage device that receives the first ODT command may turn on non-target ODT for the first NAND storage unit and thus the status 366 may show a non-target ODT enabled state 348.

When the CE enabled signal 340 on the signal line 362 ends, the CE enabled signal 344 may begin on the signal line 364. An initialization command 318 may be sent on the data bus when the CE enabled signal 344 is on the signal line 364. While the CE enabled signal 344 is still on, a second ODT command may also be transmitted via the data bus. The second ODT command may comprise a command type field 320, a first address field 322, a second address field 324, and four data fields D0 326, D1 328, D2 330 and D3 332. The Automatic Enable bit may be set (e.g., on) in the RTT setting of the data fields of the second ODT command. After the second ODT command has been transmitted, the second NAND storage device that receives the second ODT command may turn on non-target ODT for the second NAND storage unit and thus the status 368 may show a non-target ODT enabled state 356. It should be noted that the horizontal direction in both FIGS. 2 and 3 from left to right is time increasing. Thus, as shown in FIG. 3, the non-target ODT enabled state 348 for the first NAND storage unit and the non-target ODT enabled state 356 for the second NAND storage unit may overlap in time.

In one embodiment, both the non-target ODT enabled state 348 for the first NAND storage unit and the non-target ODT enabled state 356 for the second NAND storage unit may be automatically enabled by setting the Automatic Enable bit in the first ODT command and second ODT command in FIG. 3. That is, the logic circuit in the NAND storage device that hosts the NAND storage unit for which the non-target ODT command is directed to may decode the received ODT command and turn on ODT according to the configuration in the command.

A NAND storage unit in a non-target ODT enabled state may be turned into the target ODT enabled state automatically when the NAND storage unit is selected as a target for a data access operation. For example, as shown in FIG. 3, an CE enabled signal 342 may begin on the CE signal line 362 when the first NAND storage unit is selected for data access. When the CE enabled signal 342 begins, the status 366 may automatically enter a target ODT enabled state 350, which may be equivalent of turning off the non-target ODT in one embodiment (e.g., setting the resistance value to high-impedance). The data access command/data 334 may occur on the data bus during the CE signal 342. When the second NAND storage unit is subsequently selected for data access, the CE enabled signal 342 may end and a CE enabled signal 346 may appear on the CE signal line 364. Accordingly, the status 366 may change from the target ODT enabled state 350 to a non-target ODT enabled state 352 (e.g., setting the resistance value to a non-zero value, which may have been included in the data fields for the first command), and the status 368 may change from the non-target ODT enabled state 356 to a target ODT enabled state 358, which may be equivalent of turning off the non-target ODT in one embodiment (e.g., setting the resistance value to high-impedance). While the CE enabled signal 346 is on (e.g., pulled low), a data access command/data 336 directed to the second NAND storage unit may occur on the data bus 360.

Target switching shown in FIG. 3 may also be applied in a storage system in which each CE signal line may control two storage units, for example, the NAND storage system 100B. Signal line 360 may represent the data bus between the NAND controller 102B and NAND storage devices 104B.1 and 104B.2). Signal line 362 may represent the CE 108B.1 between the NAND controller 102B and the NAND storage device 104B.1. Signal line 364 may represent the CE 108B.2 between the NAND controller 100B and the NAND storage device 104B.2. Status 366 may represent the non-target ODT state for the NAND storage device 104B.1 with one of the two storage units being controlled by the ODT command and another always disabled. For example, ODT of the storage unit 106B.1 is controlled by the ODT command and ODT of the storage unit 106B.2 is always disabled. And status 368 may represent the non-target ODT state for the NAND storage device 104B.2 with one of the two storage units being controlled by the ODT command and another always disabled. For example, ODT of the storage unit 106B.3 is controlled by the ODT command and ODT of the storage unit 106B.4 is always disabled. This way, ODT status for the NAND storage device 104B.1 and NAND storage device 104B.2 are still automatically enabled and controlled by respective CE signals.

In embodiments in which the controller sends out the ODT commands with Automatic Enable bit set to the NAND storage devices during system power-on and NAND initialization stage, the target ODT may be automatically enabled when any active program operation may be performed on a NAND storage unit selected for access, and the non-target ODT may be automatically enabled when the NAND storage unit may serve as a non-target terminator during other NAND storage device's access. This may allow for the maximum flexibility for system implementation, require the least efforts in firmware implementation and incur no overhead or throughput penalty to the system performance.

It should be noted that the ODT command with the Automatic Enable bit set may be sent anytime during the operation of a storage system and does not need to be at the initialization. FIG. 3 is just an example showing how ODT commands with this Automatic Enable bit set may affect the storage system's operation.

In another example implementation, a NAND controller does not set the Automatic Enable bit in the ODT configuration field. Instead, the NAND controller may send out an ODT command every time a non-target LUN need to enable the non-target resistive terminator when another LUN may become a target and will be accessed. If the NAND controller circuit is optimized to handle the target and non-target LUNs synchronously, the NAND controller may schedule one ODT command to the target LUN to turn on target LUN ODT and another ODT command to the non-target LUN to turn on non-target LUN ODT in a sequential order with minimal latency in between. If the NAND controller is not optimized to handle the two NAND storage units synchronously, the firmware of the NAND controller may first send an ODT command to the non-target storage LUN to turn on non-target ODT, and then continue with regular commands that are targeted to the active NAND storage unit. The regular commands may be scheduled commands that need to be sent regardless whether ODT needs to be enabled. This implementation may allow for an optimal power efficiency by only turning on the ODT when it is needed. It might introduce a minimum performance overhead if supported at firmware level. However, the performance penalty may be mitigated because the NAND interface may now run at a much higher speed with the non-target ODT enabled.

The ODT command implemented by embodiments according to the present disclosure may replace conventional ODT configuration and enable commands, with one command to be reused to enable both target and non-target ODT settings according to RTT settings in the command's data fields. As shown in Table 1, the RTT fields of both target and non-target ODT may be set in the four data bytes of one ODT command and the Automatic Enable bit may provide great flexibility and reduce overhead for switching targets. For example, when a selected LUN (e.g., 106A.1) is to be accessed as a target, the NAND device, in which the selected LUN may locate, may enable ODT (e.g., 112A.1) for the selected LUN according to target RTT settings in an ODT command directed to the selected LUN while other LUNs may apply non-target RTT settings according to their respective ODT commands. When a second LUN (e.g., 106A.2) is to be accessed as a target, the NAND device, in which the second LUN may locate, may enable ODT for the second LUN according to target RTT settings while other LUNs including the previously selected LUN may apply non-target RTT settings, automatically. This way, there is no need for the controller to send ODT commands to switch from one target LUN to another target LUN. Thus, in at least one embodiment, a controller no longer sends out commands to disable and enable different target and non-target ODT settings every time it switches targets, greatly eliminating the overhead.

The storage system implementing the ODT command according to the present disclosure may have a level of flexibility and efficiency that are supported by any of the existing non-ODT techniques. For example, in the conventional two step ODT enabling process, each target sharing a common data bus has to be first assigned a unique volume address in the configuration step. Then, a termination matrix configuration is assigned to each volume so that each volume knows that it is assigned as a non-target terminator for other specified volumes. During the enabling step, the controller needs to pull low the chip enable signals of all the non-target volume (device) as well as the target device. Then, the non-target device will be put into a Sniff mode once it detects their volume address is not selected. The non-target devices will continue to monitor the input commands and turn on their ODT during the active data transfer between the controller and the target device. One ODT command according to the present disclosure may turn ODT on as target or non-target, which is much simpler and easier to implement.

Moreover, the NAND controller implementing the ODT command according to the present disclosure does not need to have a pre-existing knowledge of the NAND interface PCB topology. In comparison, the conventional NAND controller need to have a pre-existing knowledge of the NAND interface PCB topology such as which devices serve as non-target termination to which target. Although the conventional configuration step is firmware configurable, the chip enable signals are strictly hardware-controlled by the controller. Therefore, the controller must know which specific group of chip enable signals to assert low during the ODT enabling step in the conventional ODT enabling process when one target is actively accessed. This makes the controller design much more complicated and prohibitively expensive to support the various ODT configurations and chip enable functions for a wide range of potential PCB topologies.

In addition, in some Toggle NAND devices, the non-target ODT feature can be supported by a command different from the existing target ODT command. This introduces undesired latencies because the controller has to send a command to disable the target ODT and a different command to enable the non-target ODT every time it switches access between the NAND devices. In contrast, the ODT command according to the present disclosure may be a unified command in that one single command may set both target and non-target ODT settings. As shown in FIG. 3, a LUN (or NAND device) may switch from non-target ODT to target ODT depending on whether it is in active access mode (e.g., active Write or Program) with only one ODT command during the initialization process.

Furthermore, the mainstream controller designs nowadays do not support asserting multiple chip enable signals at a time. To support such a feature, it incurs not only new controller development investment but also new technological risks including racing and contention conditions that traditional controller designs have managed to avert. It is worth mentioning that there are other non-ONFI NAND flash devices in the markets that support the non-target ODT feature, but they unfortunately all require pulling low multiple chip enable signals at the same time. Controllers implementing the ODT command according to the present disclosure do not need pulling low multiple chip enable signals at the same time and the features of embodiments may be implemented in firmware. Therefore, it may be more cost efficient and easier to implement the ODT command according to the present disclosure.

Just as importantly, embodiments according to the present disclosure avoid the sniff mode, in which the non-target NAND storage devices are required to actively monitor and process the commands to determine whether they are selected as a target. The I/O and internal circuits of the non-target devices need to stay on during the sniff mode at the expense of extra power consumption. Therefore, embodiments according to the present disclosure may help reduce power consumption in the NAND storage devices.

Figure 4:
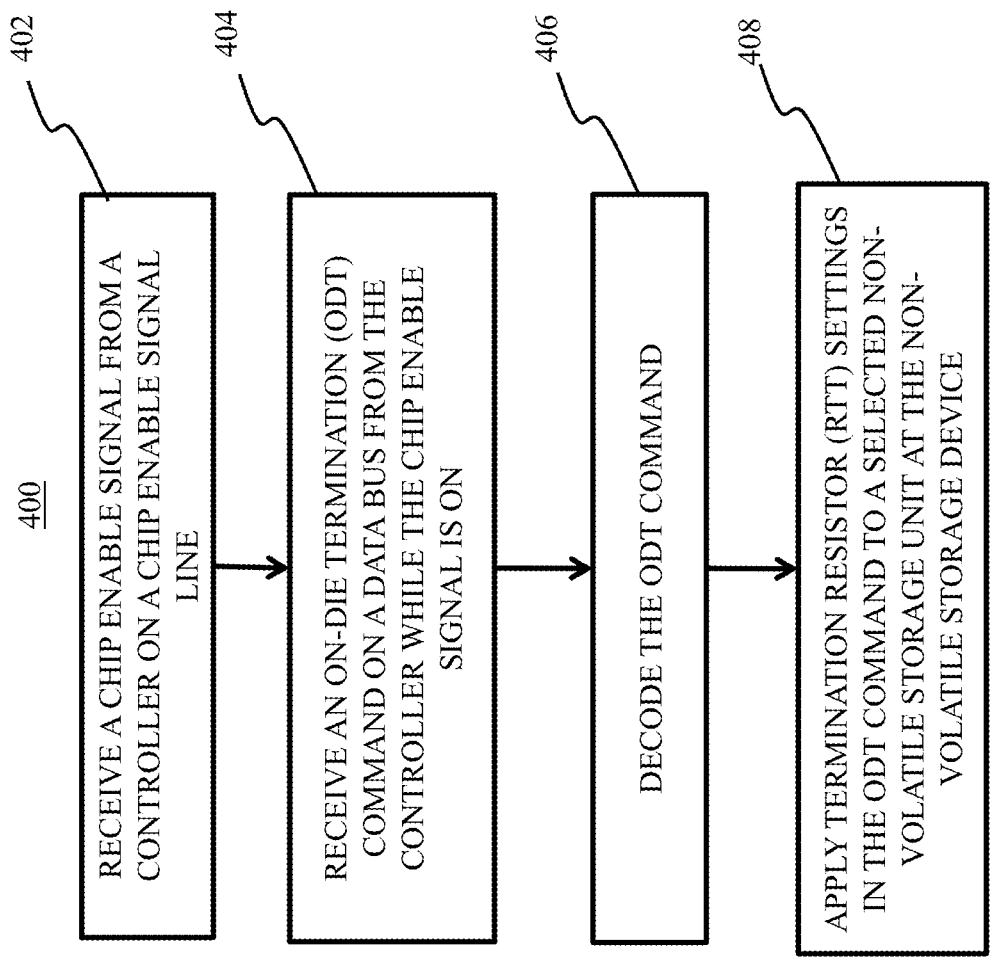
FIG. 4 is a flowchart of a process for controlling non-target on-die termination (ODT) in accordance with an embodiment of the present disclosure.

FIG. 4 is a flowchart of a process 400 for process for controlling non-target on-die termination (ODT) in in accordance with an embodiment of the present disclosure. In block 402, a chip enable signal may be received from a controller by a non-volatile storage device on a chip enable signal line. For example, the non-volatile storage device 104A.1 may receive a chip enable signal on the CE signal line 108A.1, which may be the CE signal 230 in FIG. 2 or the CE signal 340 in FIG. 3; or the non-volatile storage device 104B.1 may receive a chip enable signal on the CE signal line 108B.1, which may be the CE signal 230 in FIG. 2 or the CE signal 340 in FIG. 3. In block 404, an on-die termination (ODT) command may be received on a data bus from the controller while the chip enable signal is on. For example, the non-volatile storage device 104A.1 may receive the first ODT command in FIG. 2 while the CE signal 230 is on or receive the first ODT command in FIG. 3 while the CE signal 340 is on; or the non-volatile storage device 104B.1 may receive the first ODT command in FIG. 2 while the CE signal 230 is on or receive the first ODT command in FIG. 3 while the CE signal 340 is on.

In block 406, the on-die termination command may be decoded. For example, the non-volatile storage device 104A.1 may use the logic circuit 116A.1 to decode the ODT command received, or the non-volatile storage device 104B.1 may use the logic circuit 116B.1 to decode the ODT command received. In block 408, termination resistor (RTT) settings in the ODT command may be applied to a selected non-volatile storage unit at the non-volatile storage device to enable ODT for the selected non-volatile storage unit. For example, the on-die terminator 112A.1 of the storage unit 106A.1 may be put in the non-target ODT enabled state 234 by applying the RTT settings in the first command of FIG. 2 or put in the non-target ODT enabled state 348 by applying the RTT settings in the first command of FIG. 3; or the on-die terminator 112B.1 of the storage unit 106B.1 may be put in the non-target ODT enabled state 234 by applying the RTT settings in the first command of FIG. 2 or put in the non-target ODT enabled state 348 by applying the RTT settings in the first command of FIG. 3.

The process 400 may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the logic circuit of a non-volatile storage device may be implemented in hardware circuitry. Moreover, the process 400 may be programmed in computer processor executable instructions and performed by a computer processor (e.g., a microprocessor or a microcontroller) executing the executable instructions.

In an exemplary embodiment, there is provided a method for controlling on-die termination in a non-volatile storage device. The method may comprise: receiving a chip enable signal on a chip enable signal line from a controller, receiving an on-die termination (ODT) command on a data bus from the controller while the chip enable signal is on, decoding the on-die termination command and applying termination resistor (RTT) settings in the ODT command to a selected non-volatile storage unit at the non-volatile storage device to enable ODT for the selected non-volatile storage unit.

In one embodiment, the ODT command includes a command type code, a storage unit address and a feature address, and the RTT settings are included in a plurality of data fields of the ODT command.

In one embodiment, the command type code is a code for setting a feature and the feature address indicates that the feature is ODT.

In one embodiment, the chip enable signal line is used for controlling access to the non-volatile storage device.

In one embodiment, the chip enable signal line is used for controlling access to a pair of non-volatile storage units that include the selected non-volatile storage unit.

In one embodiment, the RTT settings include target ODT settings and non-target ODT settings.

In one embodiment, the ODT command includes a configuration setting for the selected non-volatile storage device to automatically enable non-target ODT.

In one embodiment, the method may further comprise receiving another chip enable signal on the chip enable signal line and another storage unit address on the data bus from the controller to select the selected non-volatile storage unit for a data access operation, receiving a data access command, data, or both, for the data access operation on the data bus while the another chip enable signal is on, automatically switching to a target ODT setting at the selected non-volatile storage unit for the data access operation and performing the data access operation with the target ODT setting.

In one embodiment, the target ODT setting is an ODT resistance value of high-impedance.

In one embodiment, the method may further comprise disabling ODT for the selected non-volatile storage unit by a subsequent ODT command, a Read command or a RESET command.

In another exemplary embodiment, there is provided a non-volatile storage system. The non-volatile storage system may comprise a controller and a non-volatile storage device coupled to the controller by at least a chip enable signal line and a data bus. The non-volatile storage device may be configured to receive a chip enable signal from the controller on the chip enable signal line, receive an on-die termination (ODT) command on the data bus from the controller while the chip enable signal is on, decode the on-die termination command and apply termination resistor (RTT) settings in the ODT command to a selected non-volatile storage unit at the non-volatile storage device.

In one embodiment, the ODT command includes a command type code, a storage unit address and a feature address, and the RTT settings are included in a plurality of data fields of the ODT command.

In one embodiment, the command type code is a code for setting a feature and the feature address indicates that the feature is ODT.

In one embodiment, the chip enable signal line is used for controlling access to the non-volatile storage device.

In one embodiment, the chip enable signal line is used for controlling access to a pair of non-volatile storage units that include the selected non-volatile storage unit.

In one embodiment, the RTT settings include target ODT settings and non-target ODT settings.

In one embodiment, the ODT command includes a configuration setting for the selected non-volatile storage device to automatically enable non-target ODT.

In one embodiment, the non-volatile storage device may be further configured to receive another chip enable signal on the chip enable signal line and another storage unit address on the data bus from the controller to select the selected non-volatile storage unit for a data access operation, receive a data access command, data, or both, for the data access operation on the data bus while the another chip enable signal is on, automatically switch to a target ODT setting at the selected non-volatile storage unit for the data access operation and performing the data access operation with the target ODT setting.

In one embodiment, the target ODT setting is an ODT resistance value of high-impedance.

In one embodiment, the non-volatile storage system may further comprise disabling ODT for the selected non-volatile storage unit by a subsequent ODT command, a Read command or a RESET command.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for controlling on-die termination in a non-volatile storage device, comprising:
   receiving an on-die termination (ODT) command on a data bus from a controller while a chip enable signal for the non-volatile storage device is on;
   decoding the ODT command; and
   applying configuration settings in the ODT command to a selected non-volatile storage unit at the non-volatile storage device to enable ODT for the selected non-volatile storage unit, wherein the configuration settings include an automatic enable bit being set, and applying the configuration settings for the selected non-volatile storage unit includes turning on non-target ODT and maintaining a non-target ODT enabled state, automatically applying a target ODT setting for a data access operation and returning to the non-target ODT state after the data access operation.

2. The method of claim 1, wherein the ODT command includes a command type code, a storage unit address and a feature address, and the configuration settings are included in a plurality of data fields of the ODT command.

3. The method of claim 2, wherein the command type code is a code for setting a feature and the feature address indicates that the feature is ODT.

4. The method of claim 1, wherein the chip enable signal is transmitted on a chip enable signal line, and the chip enable signal line is used for controlling access to the non-volatile storage device.

5. The method of claim 1, wherein the chip enable signal is transmitted on a chip enable signal line, and the chip enable signal line is used for controlling access to a pair of non-volatile storage units that include the selected non-volatile storage unit.

6. The method of claim 1, wherein the configuration settings include termination resistor (RTT) settings that include target ODT settings and non-target ODT settings.

7. The method of claim 1, wherein the target ODT setting is an ODT resistance value of high-impedance.

8. The method of claim 1, further comprising receiving a subsequent ODT command with configuration settings including the automatic enable bit being off and applying the configuration settings in the subsequent ODT command to the selected non-volatile storage unit, wherein after applying the configuration settings in the subsequent ODT command, the selected non-volatile storage unit does not turn the non-target ODT back on after another data access operation.

9. A non-volatile storage system, comprising:
   a controller; and
   a non-volatile storage device coupled to the controller by at least a chip enable signal line and a data bus, the non-volatile storage device configured to:
      receive an on-die termination (ODT) command on the data bus from the controller while a chip enable signal for the non-volatile storage device is on;
      decode the ODT command; and
      apply configuration settings in the ODT command to a selected non-volatile storage unit at the non-volatile storage device to enable ODT for the selected non-volatile storage unit, wherein the configuration settings include an automatic enable bit being set, and applying the configuration settings includes turning on non-target ODT for the selected non-volatile storage unit and maintaining a-n-a non-target ODT enabled state for the selected non-volatile storage unit, automatically applying a target ODT setting for a data access operation and returning to the non-target ODT state after the data access operation for the selected non-volatile storage unit.

10. The non-volatile storage system of claim 9, wherein the ODT command includes a command type code, a storage unit address and a feature address, and the configuration settings are included in a plurality of data fields of the ODT command.

11. The non-volatile storage system of claim 10, wherein the command type code is a code for setting a feature and the feature address indicates that the feature is ODT.

12. The non-volatile storage system of claim 9, wherein the chip enable signal line is used for controlling access to the non-volatile storage device.

13. The non-volatile storage system of claim 9, wherein the chip enable signal line is used for controlling access to a pair of non-volatile storage units that include the selected non-volatile storage unit.

14. The non-volatile storage system of claim 9, wherein the configuration settings include termination resistor (RTT) settings that include target ODT settings and non-target ODT settings.

15. The non-volatile storage system of claim 9, wherein the target ODT setting is an ODT resistance value of high-impedance.

16. The non-volatile storage system of claim 9, wherein the non-volatile storage device is further configured to receive a subsequent ODT command with configuration settings including the automatic enable bit being off and apply the configuration settings in the subsequent ODT command to the selected non-volatile storage unit, wherein after applying the configuration settings in the subsequent ODT command, the selected non-volatile storage unit does not turn the non-target ODT back on after another data access operation.

* * * * *